(12) United States Patent
Park et al.

(10) Patent No.: US 9,473,022 B2
(45) Date of Patent: Oct. 18, 2016

(54) SELF-BIASED CHARGE PUMP

(71) Applicant: QUALCOMM Incorporated, San Diego, CA (US)

(72) Inventors: Dongmin Park, San Diego, CA (US); Lai Kan Leung, San Marcos, CA (US); Jong Min Park, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/618,369

(22) Filed: Feb. 10, 2015

(65) Prior Publication Data

US 2016/0233764 A1    Aug. 11, 2016

(51) Int. Cl.
*H03L 7/06*    (2006.01)
*H02M 3/07*    (2006.01)
*H03L 7/08*    (2006.01)

(52) U.S. Cl.
CPC . *H02M 3/07* (2013.01); *H03L 7/08* (2013.01)

(58) Field of Classification Search
None
See application file for complete search history.

(56) References Cited

U.S. PATENT DOCUMENTS

| | | | |
|---|---|---|---|
| 6,664,829 B1 | 12/2003 | Hughes | |
| 7,161,401 B2 | 1/2007 | Li | |
| 7,750,695 B2 | 7/2010 | Caplan et al. | |
| 7,884,655 B2 | 2/2011 | Marton et al. | |
| 8,044,724 B2 * | 10/2011 | Rao | H03L 7/0898 331/16 |
| 8,330,511 B2 | 12/2012 | Raghunathan et al. | |
| 2005/0189973 A1* | 9/2005 | Li | H03L 7/0896 327/157 |
| 2011/0057695 A1* | 3/2011 | Lee | H03L 7/0893 327/157 |
| 2013/0076450 A1* | 3/2013 | Rao | H03L 7/0896 331/34 |

FOREIGN PATENT DOCUMENTS

| | | |
|---|---|---|
| EP | 1292033 A1 | 3/2003 |
| EP | 2101414 A1 | 9/2009 |
| WO | 03088494 A1 | 10/2003 |

OTHER PUBLICATIONS

Jakobsson A., et al., "Frequency Synthesizer with Dual Loop Frequency and Gain Calibration," IEEE Transactions on Circuits and Systems—I: Regular Papers, Nov. 2013, vol. 60 (11), pp. 2911-2919.
International Search Report and Written Opinion—PCT/US2016/012879—ISA/EPO—May 23, 2016.

* cited by examiner

*Primary Examiner* — Cassandra Cox
(74) *Attorney, Agent, or Firm* — Procopio, Cory, Hargreaves & Savitch, LLP

(57) ABSTRACT

An apparatus including: a current source configured to generate current; a switching current source circuit coupled to the current source and a first bias node to allow the current to flow through the switching current source circuit into the first bias node; a first bias circuit configured to receive a first control signal from a phase detector, the first bias circuit configured to mirror the current flowing through the switching current source circuit in response to the first control signal; a second bias circuit coupled to the first bias circuit at an output node and a second bias node, the second bias circuit configured to receive a second control signal from the phase detector; and a transconductance amplifier configured to receive a feedback signal from the output node and generate an output current to control the second biasing node.

20 Claims, 7 Drawing Sheets

SELF-BIASED CHARGE PUMP

BACKGROUND

1. Field

This invention relates generally to charge pump, and more specifically, to a self-biased charge pump for a phase-locked loop.

2. Background

A phase-locked loop (PLL) is a control system that generates an output signal whose phase is related to the phase of an input signal. The PLL is widely used in radio, telecommunications, computers and other electronic applications. They can be used to demodulate a signal, recover a signal from a noisy communication channel, generate a stable frequency at multiples of an input frequency, or distribute precisely timed clock pulses in digital logic circuits such as microprocessors.

The PLL may include a phase detector, a charge pump, a loop filter, a voltage-controlled oscillator (VCO), and a frequency divider. The VCO generates an output signal. The phase detector receives an input signal, compares the phase of the VCO-generated output signal with the phase of the input signal, and adjusts the VCO to keep the phases matched. The output of the phase detector also acts as a current source to pump current into and out of the loop filter by sending UP and DN signals to the charge pump to turn the charge pump on and off periodically. Since UP/DN current matching in a charge-pump is important to reduce noise and spur, the charge pump uses a replica bias branch for each of the UP circuit and the DN circuit. However, the replica bias branches add additional noise on the charge pump.

SUMMARY

The present disclosure provides for removing the replica bias branches, and using the main branch to calibrate the UP/DN current during off state.

In one embodiment, an apparatus is disclosed. The apparatus includes: a current source configured to generate current; a switching current source circuit coupled to the current source and a first bias node to allow the current to flow through the switching current source circuit into the first bias node; a first bias circuit configured to receive a first control signal from a phase detector, the first bias circuit configured to mirror the current flowing through the switching current source circuit in response to the first control signal; a second bias circuit coupled to the first bias circuit at an output node and a second bias node, the second bias circuit configured to receive a second control signal from the phase detector; and a transconductance amplifier configured to receive a feedback signal from the output node and generate an output current to control the second biasing node.

In another embodiment, an apparatus is disclosed. The apparatus includes: a current source configured to generate current; a switching current source circuit coupled to the current source and a first bias node to allow the current to flow through the switching current source circuit into the first bias node; a first bias circuit configured to receive a first control signal from a phase detector, the first bias circuit configured to mirror the current flowing through the switching current source circuit in response to the first control signal; a second bias circuit coupled to the first bias circuit at an output node and a second bias node, the second bias circuit configured to receive a second control signal from the phase detector; and a unity gain buffer having a positive input terminal, a negative input terminal, and an output terminal, the positive input terminal configured to receive an input signal, the negative input terminal coupled to the output terminal, wherein the output terminal is coupled to the output node, the first bias circuit and the second bias circuit.

In another embodiment, a phase-locked loop is disclosed. phase-locked loop includes: a phase detector configured to receive a reference signal and a divider output signal and output a control signal and a complementary control signal; a charge pump including: a current source configured to generate current; a switching current source circuit coupled to the current source and a first bias node to allow the current to flow through the switching current source circuit into the first bias node; a first bias circuit configured to receive a first control signal from a phase detector, the first bias circuit configured to mirror the current flowing through the switching current source circuit in response to the first control signal; a second bias circuit coupled to the first bias circuit at an output node and a second bias node, the second bias circuit configured to receive a second control signal from the phase detector; a transconductance amplifier configured to receive a feedback signal from the output node and generate an output current to control the second biasing node; a low pass filter configured to receive the current pulse train signal and output a control voltage; a voltage controlled oscillator configured to receive the control voltage and output a corresponding frequency signal; and a frequency divider configured receive the corresponding frequency signal and output the divider output signal for feedback to the phase detector.

Other features and advantages of the present disclosure should be apparent from the present description which illustrates, by way of example, aspects of the present invention.

BRIEF DESCRIPTION OF THE DRAWINGS

The details of the present disclosure, both as to its structure and operation, may be gleaned in part by study of the appended further drawings, in which like reference numerals refer to like parts, and in which.

DETAILED DESCRIPTION

Certain embodiments as described herein provide for removing the replica bias branches, and using the main branch to calibrate the UP/DN current during off state. Since the charge pump is turned on for a very short period of time due to a small phase error when the PLL is locked, the remaining time can be used by the main branch to calibrate the current. Since the main branch is used for the current calibration, there is no matching concern between the replica and main branches. The current matching is only determined by the loop gain. Further, the use of the main branch to calibrate the current results in the reduction of the low frequency noise of the main branch, which enables the use of smaller-sized transistors. The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
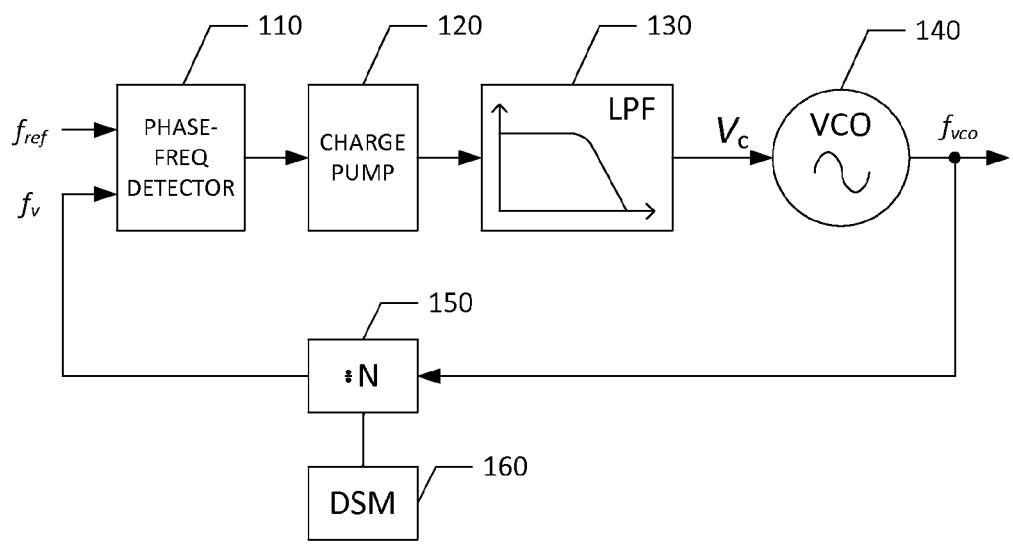
FIG. 1 is a block diagram of a phase-locked loop (PLL)

FIG. 1 is a block diagram of a phase-locked loop (PLL) 100, which includes a phase detector 110, a charge pump 120, a loop filter 130, a VCO 140, a frequency divider 150, and a delta sigma modulator (DSM) 160. The VCO 140 generates an output signal. The phase detector 110 receives a reference clock signal ($f_{ref}$) at its first input lead from a source such as a crystal oscillator. The phase detector 110 also receives the divider output signal ($f_v$) at its second input lead. Using these signals, the phase detector 110 compares and adjusts the VCO 140 to keep the phases matched. The phase detector 110 further generates an up charge pump control signal (UP) and a down charge pump control signal (DN). The UP and DN signals are supplied to the charge pump 120. Thus, the output of the phase detector 110 acts as a current source to pump current into and out of the loop filter 130 using the charge pump 120 by turning the charge pump on and off periodically. The frequency divider 150 divides the single-bit VCO output signal ($f_{vco}$) by a multi-bit digital divisor value generated by the DSM 160, and outputs the resulting divided-down single-bit feedback signal ($f_v$) to the second input lead of the phase detector 110.

Figure 2:
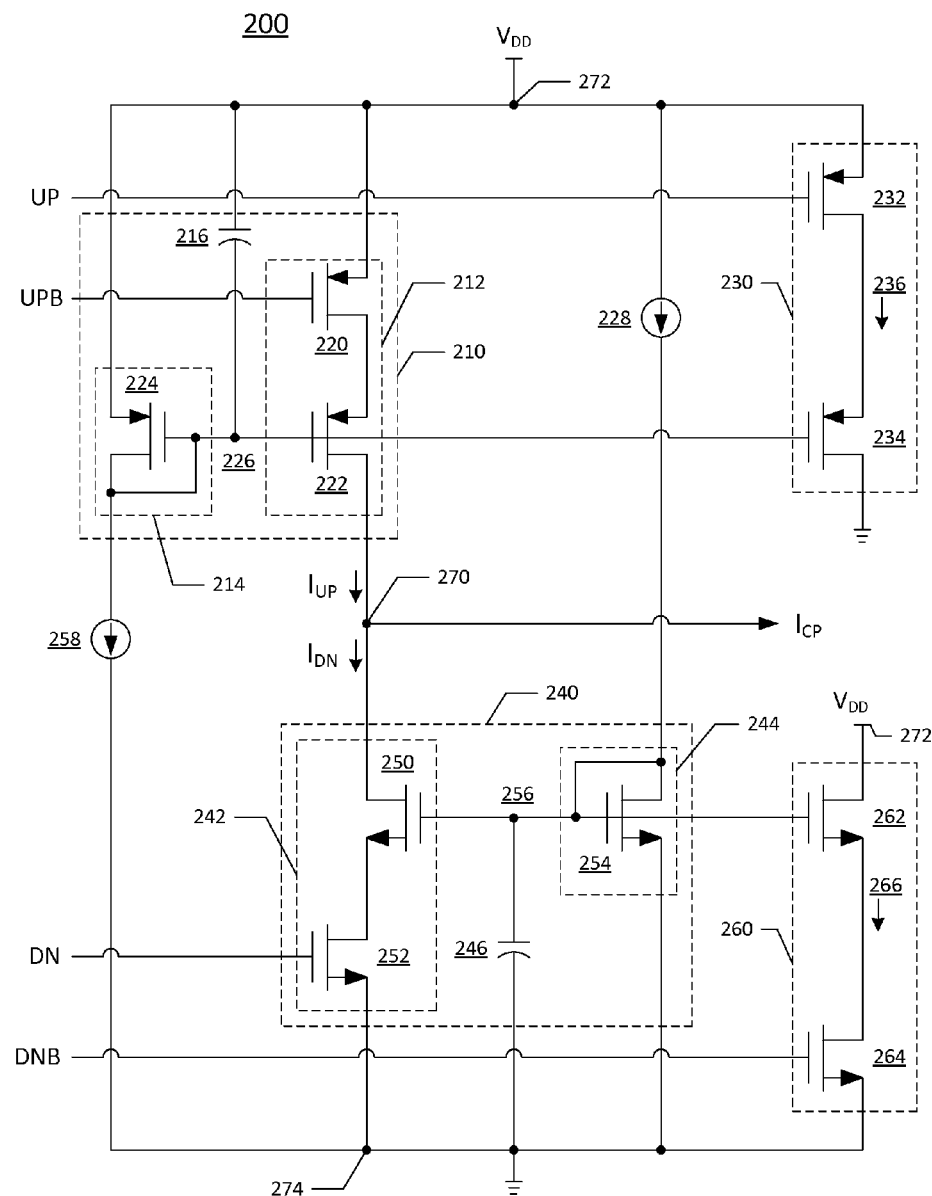
FIG. 2 is a schematic diagram of a charge pump that is one embodiment of the charge pump shown in FIG. 1.

FIG. 2 is a schematic diagram of a charge pump 200 that is one embodiment of the charge pump 120 of FIG. 1. In FIG. 2, the charge pump 200 includes a DN current mirror circuit 240, UP current mirror circuit 210, a DN replica bias circuit 260, an UP replica bias circuit 230, a DN current source 228, and an UP current source 258. The charge pump output node 270 outputs current pulse signal $I_{CP}$. In general, a current mirror is a circuit block which functions to produce a copy of the current in one active device by replicating the current in another active device. An important feature of the current mirror is a relatively high output resistance which helps to keep the output current constant regardless of load conditions. Another feature of the current mirror is a relatively low input resistance which helps to keep the input current constant regardless of drive conditions.

The DN current mirror circuit 240 includes a DN bias circuit 242, a DN switching current circuit 244, and a capacitor 246. The DN bias circuit 242 further includes an n-channel mirror transistor 250 and an n-channel switch transistor 252. The gate terminal of the mirror transistor 250 is coupled to a DN bias node 256. The gate terminal of the switch transistor 252 is controlled by the DN signal. The mirror transistor 250 and the mirror transistor 254 of the DN switching current circuit 244 form a current mirror. When the switch transistor 252 is turned on, the current flowing from supply node 272, through current source 228, and through the DN switching current circuit 244, is mirrored onto the DN bias circuit 242 and current $I_{DN}$ flows from the output node 270 through the DN bias circuit 242 and to the ground node 274.

The DN replica bias circuit 260 further includes a first n-channel transistor 262 and a second n-channel transistor 264. Transistors 262, 264 form a replica bias circuit because their geometries and layout are substantially identical to the transistors of the DN bias circuit 242. Thus, the first transistor 262 has identical width and length dimensions as the mirror transistor 250, and the second transistor (or switch transistor) 264 has identical width and length dimensions as switch transistor 252. The gate terminal of the first transistor 262 is coupled to the bias node 256 of the current mirror circuit 240. The gate terminal of the second transistor 264 is controlled by the signal DNB, which is a complementary signal to the signal DN. When the signal DNB is asserted high and the voltage at bias node 256 is sufficient to turn on the first transistor 262, a replica current 266 flows from supply node 272, through the first transistor 262, through the second transistor 264 and to the ground node 274.

The UP current mirror circuit 210 includes an UP bias circuit 212, an UP switching current circuit 214, and a capacitor 216. The UP bias circuit 212 further includes a p-channel mirror transistor 222 and a p-channel switch transistor 220. The gate terminal of the mirror transistor 222 is coupled to an UP bias node 226. The gate terminal of the switch transistor 220 is controlled by the UPB signal, an inverted version of the UP signal. The UP switching current circuit 214 further includes a p-channel mirror transistor 224. The gate terminal of the mirror transistor 224 is coupled to the bias node 226. The mirror transistors 222, 224 form a current mirror. When the switch transistor 220 is turned on, the current flowing from the supply node 272 through the UP switching current circuit 214 is mirrored onto the UP bias circuit 212 and current $I_{UP}$ flows from the supply node 272, through the UP bias circuit 212, and into the charge pump output node 270.

The UP replica bias circuit 230 further includes a first p-channel transistor 234 and a second p-channel transistor 232. The first transistor 234 and the second transistor 232 form a replica bias circuit because their geometries and layout are substantially identical to the transistors of the UP bias circuit 212. Thus, the first transistor 234 has identical width and length dimensions as the mirror transistor 222, and the second transistor (or switch transistor) 232 has identical width and length dimensions as the switch transistor 220. The source terminal of the first transistor 234 is coupled to the drain terminal of the second transistor 232, and the drain terminal of the first transistor 234 is coupled to ground node 274. The gate terminal of the first transistor 234 is coupled to the bias node 226 of the current mirror circuit 210. The source terminal of the second transistor 232 is coupled to supply node 272. The gate terminal of the second transistor 232 is controlled by the UP signal. When the UP signal transitions from a high digital logic level to a low digital logic level, and the voltage at bias node 226 is sufficiently low to turn on the first transistor 234, a replica current 236 flows from the supply node 272, through the second transistor 232, through the first transistor 234 and to the ground node 274. Although FIG. 2 shows all transistors in the DN current mirror circuit 240 and the DN replica bias circuit 260 as n-channel metal oxide semiconductor field-effect transistors (MOSFETs), while all transistors in the UP current mirror circuit 210 and the UP replica bias circuit 230 as p-channel MOSFETs, the circuits 210, 230, 240, 260 can be configured with any combination of n-channel and p-channel MOSFETs or other types of transistors.

In operation, when the DN signal goes high, the current $I_{DN}$ is made to flow through the DN bias circuit 242. The magnitude of the current $I_{DN}$ is set by the current flowing through current source 228. When the current flows through the DN current mirror circuit 240, there are perturbations on the DN bias node 256, and when the current stops flowing through the DN current mirror circuit 240, there are other perturbations. By providing the DN replica bias circuit 260 that switches in an opposite fashion to the DN current mirror circuit 240, where the transistors of the DN replica bias circuit 260 are replicas of corresponding transistors in the DN bias circuit 242, the voltage disturbance caused by turning on the DN current mirror circuit 240 are counteracted by opposite voltage disturbances when the DN replica bias circuit 260 is turned off. Similarly, the UP replica bias circuit 230 tends to counteract voltage disturbances on the UP bias node 226 caused by switching the UP current mirror circuit 210. Thus, the replica bias circuits 260, 230 are provided to reduce the effect of these voltage disturbances on the bias nodes 256, 226. However, the replica bias branches add additional noise on the charge pump.

Accordingly, in some embodiments, the replica bias branches can be removed and the main branch is used to calibrate the UP/DN current. Since the charge pump is turned on for a very short period of time due to a small phase error when the PLL is locked, the remaining time can be used by the main branch to calibrate the current. Since the main branch is used for the current calibration, there is no matching concern between replica and main branch. The current matching is only determined by the loop gain. Further, the use of the main branch to calibrate the current results in the reduction of the low frequency noise of the main branch, which enables the use of smaller size transistors.

Figure 3:
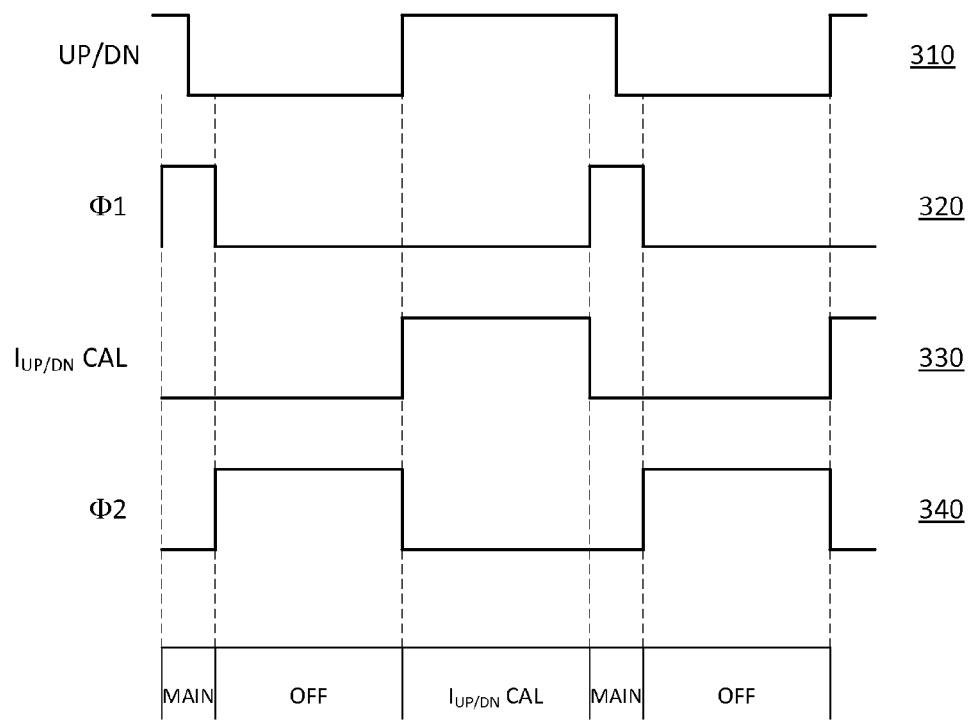
FIG. 3 is a timing diagram for different configurations of the charge pump in accordance with one embodiment of the present disclosure.

FIG. 3 is a timing diagram 300 for different configurations of the charge pump in accordance with one embodiment of the present disclosure. The timing diagram 300 of FIG. 3 shows that when the UP/DN signal 310 transitions from a high digital logic level to a low digital logic level, Φ1 signal 320 is asserted to configure the charge pump into a main mode using the main branch. When the UP/DN signal 310 is at a high digital logic level and Φ1 signal 320 is not asserted, the charge pump is configured into an UP/DN current calibration mode (see 330) using the $I_{UP/DN}$ calibration branch. Further, when the charge pump is not in the main mode or the UP/DN current calibration mode, the charge pump is placed into an off mode as shown by Φ2 signal 340. As stated above, the charge pump can use the main branch during this off mode (with Φ2 signal asserted) to further calibrate the UP/DN current.

Figure 4:
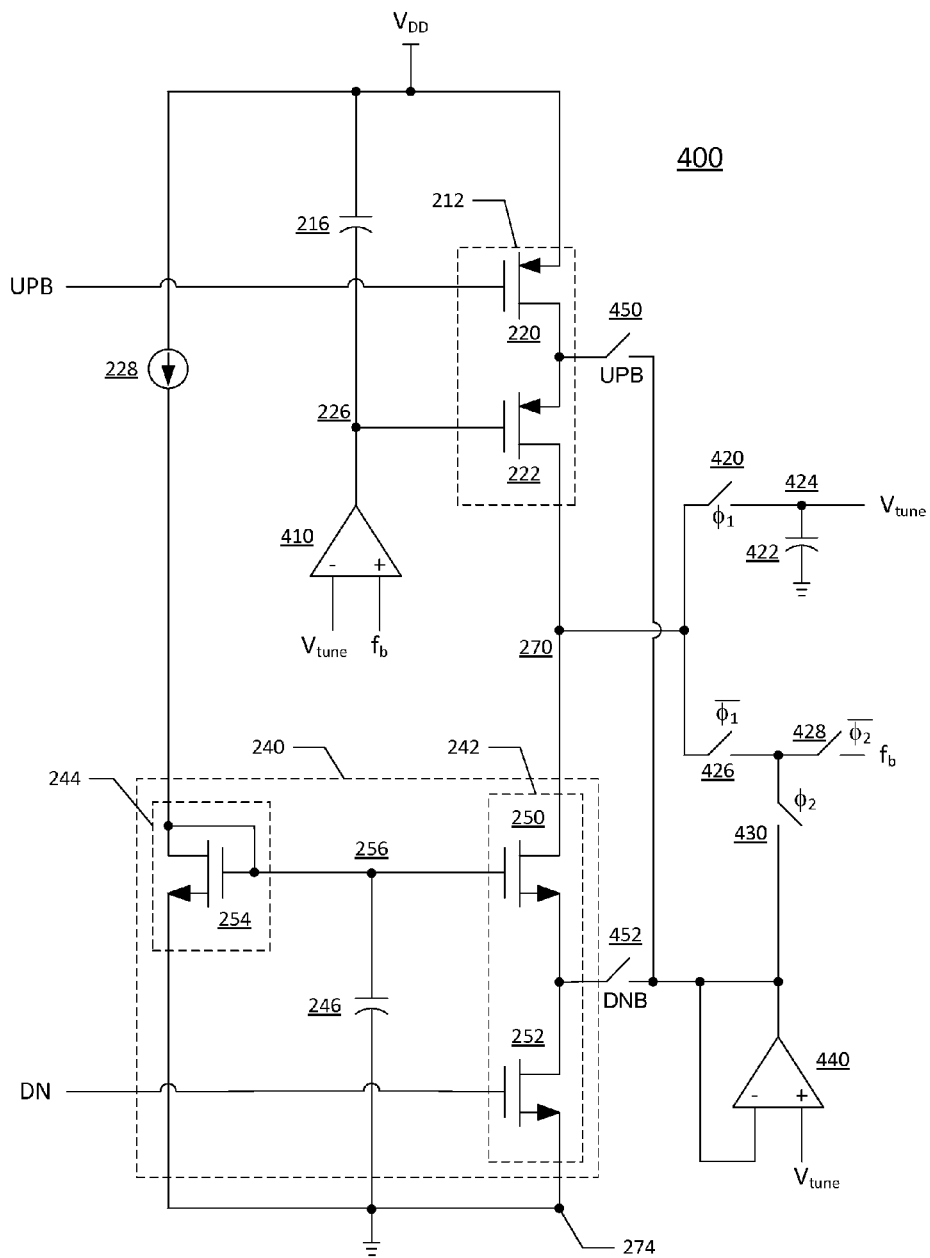
FIG. 4 is a schematic diagram of a charge pump configured with replica branches removed and UP/DN current matched using a loop gain in accordance with one embodiment of the present disclosure.

FIG. 4 is a schematic diagram of a charge pump 400 configured with replica branches (shown in FIG. 2) removed and the UP/DN current matched using a loop gain in accordance with one embodiment of the present disclosure. In various embodiments, the charge pump 400 is configured into a dynamic calibration circuit having a calibration loop using a $V_{tune}$ signal. In this configuration, the current matching is only determined by the loop gain. Further, dynamically calibrating the current provides improved PLL references spurs and reduced in-band charge pump noise.

In FIG. 4, the UP switching current circuit 214, the UP current source 258, the UP replica bias circuit 230, and the DN replica bias circuit 260 shown in FIG. 2 are removed. Thus, in the illustrated embodiment of FIG. 4, the operational transconductance amplifier (OTA) 410 is used to calibrate the current at the UP bias node 226. Further, switches 450, 452, 420, 426, 428, 430, a capacitor 422, and a unity gain buffer 440 are used to configure the feedback signals $V_{tune}$ and $f_b$, which are input to the OTA 410. The unity gain buffer 440 is configured as a unity-gain voltage follower with a tuning voltage ($V_{tune}$) as an input. Switches 450, 452 are controlled by UPB and DNB signals, respectively. Switches 420, 426 are controlled by two complementary signals Φ1 and $\overline{Φ1}$, respectively. As stated above, Φ1 signal is asserted when the UP/DN signal 310 transitions from a high digital logic level to a low digital logic level. Switches 430, 428 are controlled by two complementary signals Φ2 and $\overline{Φ2}$. As shown in the timing diagram of FIG. 3, Φ2 signal is asserted when the charge pump is neither in the main mode (Φ1 signal asserted) nor in the UP/DN current calibration mode to further calibrate the UP/DN current during the off mode.

Figure 5A:
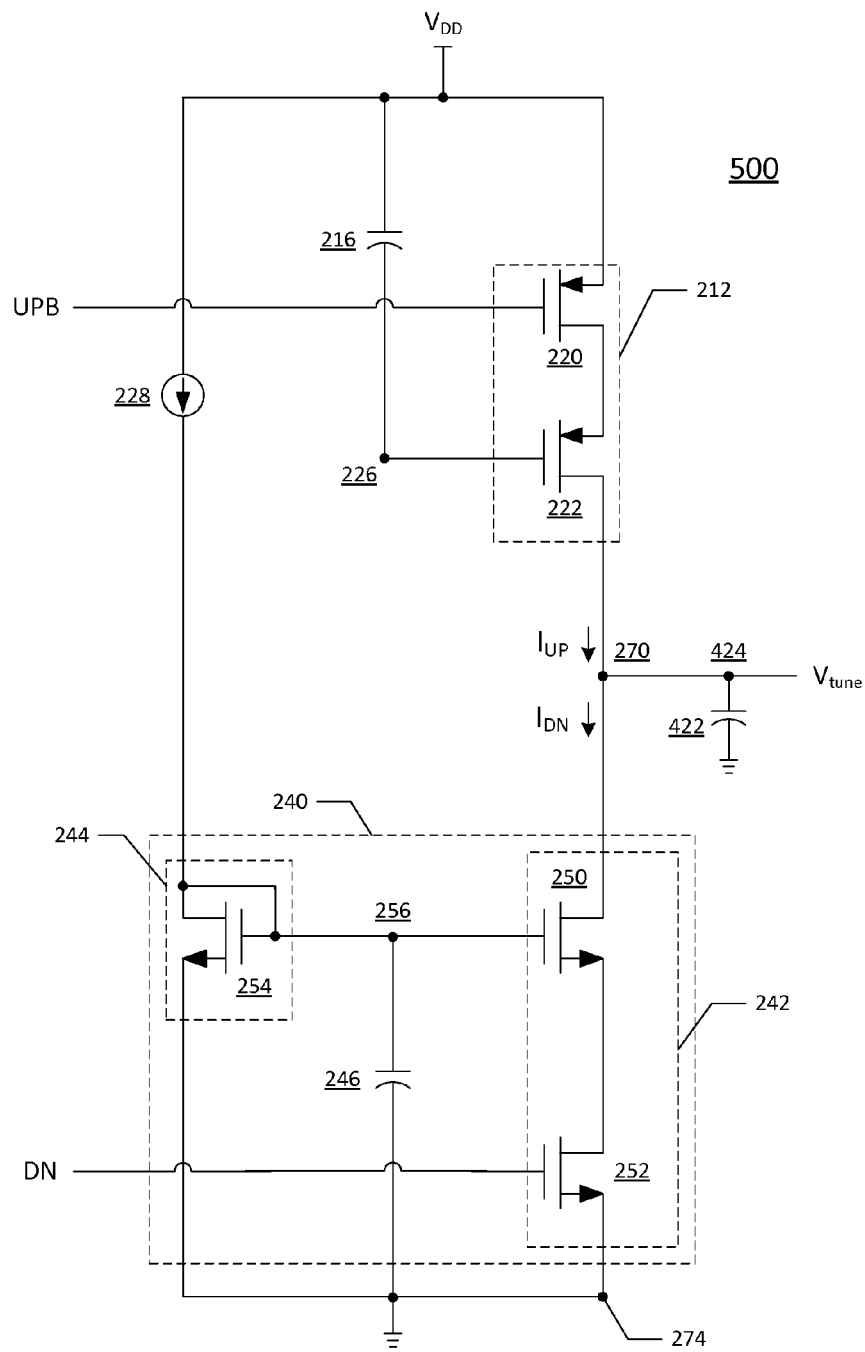
FIG. 5A is a schematic diagram of a charge pump configured into a main mode in accordance with one embodiment of the present disclosure.

FIG. 5A is a schematic diagram of a charge pump 500 configured into a main mode in accordance with one embodiment of the present disclosure. From FIG. 4, the charge pump is configured into this mode by asserting Φ1 signal (and $\overline{Φ2}$ signal) and de-asserting Φ2 signal (and $\overline{Φ1}$ signal). That is, switches 420 and 428 are closed, while switches 426 and 430 are open. Switches 450 and 452 are also open. Accordingly, in this mode, the charge pump 500 outputs current at the output node 270 by controlling currents $I_{UP}$ and $I_{DN}$ using UPB and DN signals received at the switch transistors 220 and 252, respectively.

Figure 5B:
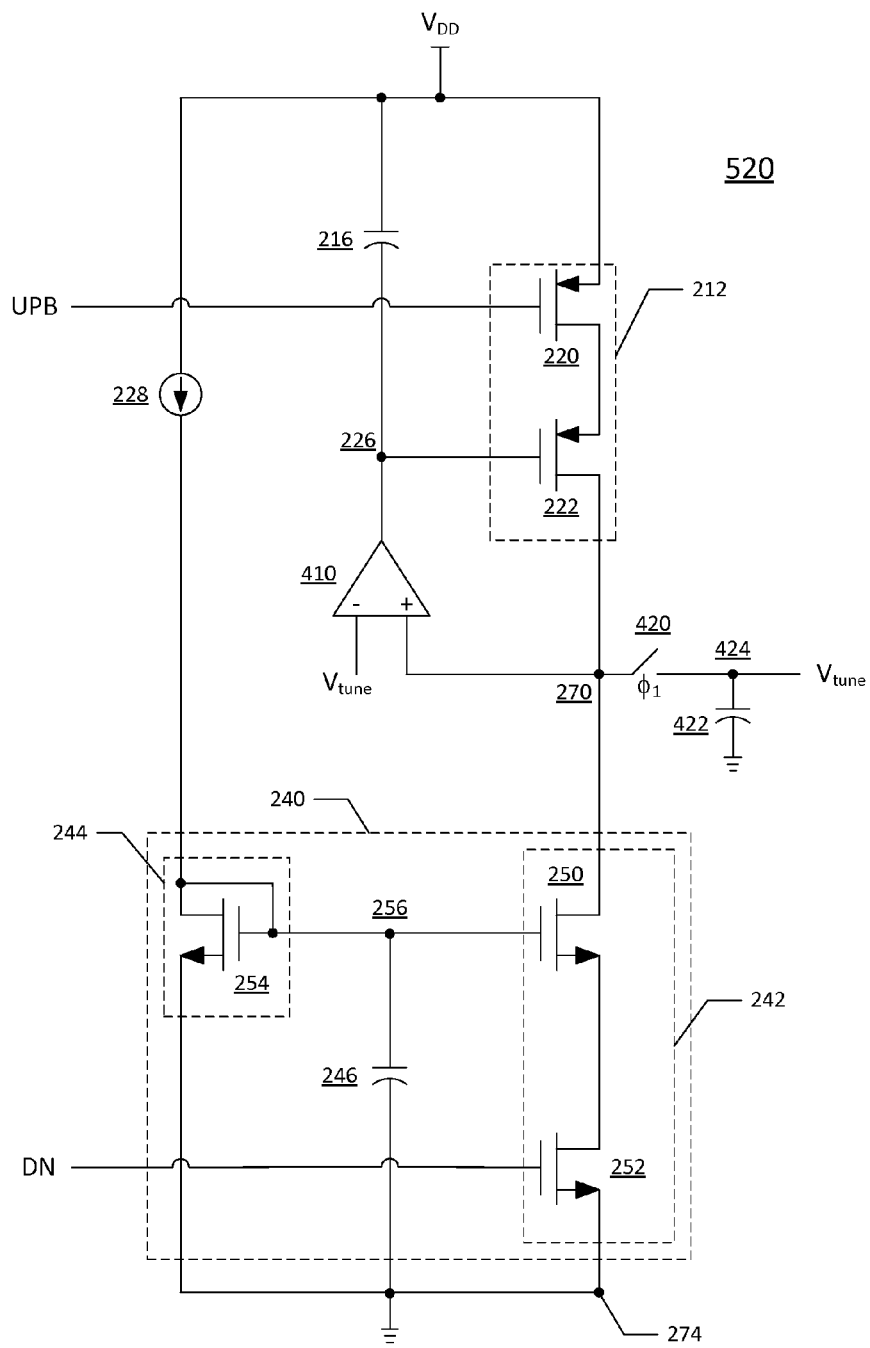
FIG. 5B is a schematic diagram of a charge pump configured into an UP/DN current calibration mode in accordance with another embodiment of the present disclosure.

FIG. 5B is a schematic diagram of a charge pump 520 configured into an UP/DN current calibration mode in accordance with another embodiment. From FIG. 4, the charge pump is configured into this mode by de-asserting both Φ1 and Φ2 signals (and asserting both $\overline{Φ1}$ and $\overline{Φ2}$ signal). That is, switches 420 and 430 are open, while switches 426 and 428 are closed. Switches 450 and 452 are also open. Accordingly, in this mode, the charge pump 520 is configured to calibrate the UP/DN current and the UP bias node 226 using the OTA 410 with the feedback of the output current at node 270.

Figure 5C:
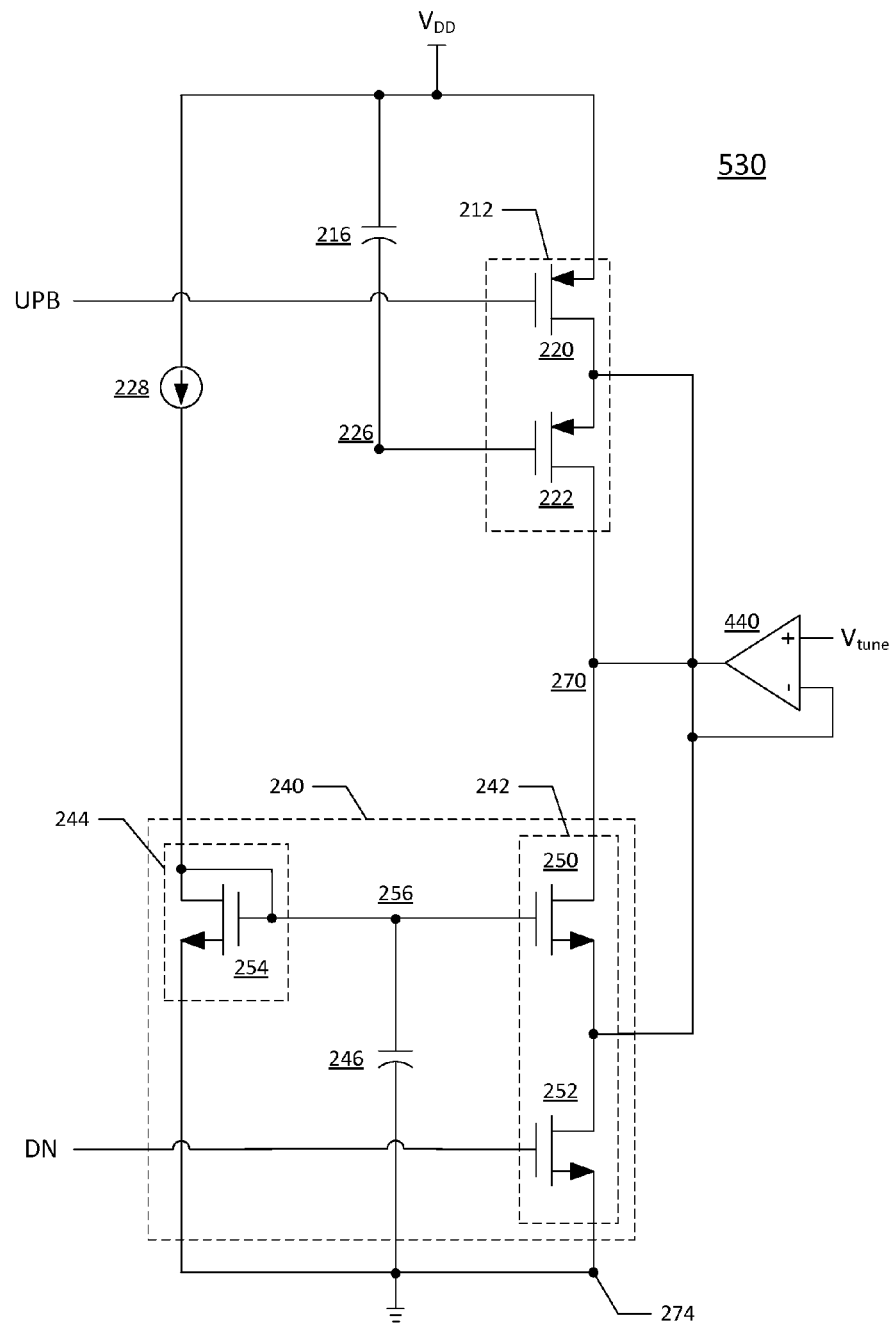
FIG. 5C is a schematic diagram of a charge pump configured into a current calibration mode using the main branch during the off state in accordance with another embodiment of the present disclosure.

FIG. 5C is a schematic diagram of a charge pump 530 configured into a current calibration mode using the main branch during the off state in accordance with another embodiment of the present disclosure. From FIG. 4, the charge pump is configured into this mode by asserting Φ2 signal (and $\overline{Φ1}$ signal) and de-asserting Φ1 signal (and $\overline{Φ2}$ signal). That is, switches 420 and 428 are open, while switches 426 and 430 are closed. Switches 450 and 452 are also closed. Accordingly, in this mode, the charge pump 530 is configured to further calibrate the UP/DN current using a unity gain buffer 440 to compensate for the leakage of the mirror transistors 222, 250.

Although several embodiments of the present disclosure are described above, many variations of the present disclosure are possible. For example, although the illustrated embodiments described above configure the charge pump with transistors and capacitors, other elements such as buffers, operational amplifiers, and switches can be used to configure the charge pump. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the present disclosure. In addition, the grouping of functions within a module, block, or step is for ease of description. Specific functions or steps can be moved from one module or block without departing from the present disclosure.

The various illustrative logical blocks, units, steps, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The above description of the disclosed embodiments is provided to enable any person skilled in the art to make or use the invention described in the present disclosure. Various modifications to these embodiments will be readily apparent to those skilled in the art, and the generic principles described herein can be applied to other embodiments without departing from the spirit or scope of the present disclosure. Thus, it is to be understood that the description and drawings presented herein represent presently preferred embodiments of the present disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

The invention claimed is:

1. An apparatus comprising:
a current source configured to generate current;
a switching current source circuit coupled to the current source and a first bias node to allow the current to flow through the switching current source circuit into the first bias node;
a first bias circuit configured to receive a first control signal from a phase detector, the first bias circuit configured to mirror the current flowing through the switching current source circuit in response to the first control signal;
a second bias circuit coupled to the first bias circuit at an output node and a second bias node, the second bias circuit configured to receive a second control signal from the phase detector; and
a transconductance amplifier configured to receive a feedback signal from the output node and generate an output current to control the second biasing node.

2. The apparatus of claim 1, wherein the apparatus is a charge pump of a phase-locked loop.

3. The apparatus of claim 1, wherein the first control signal is a down signal to draw the current out of the output node.

4. The apparatus of claim 1, wherein the second control signal is a complementary up signal to pump the current into the output node.

5. The apparatus of claim 1, wherein the switching current source circuit comprises a first transistor configured with a gate terminal coupled to the first bias node, a drain terminal coupled to the current source and the gate terminal, and a source terminal coupled to a ground voltage.

6. The apparatus of claim 5, further comprising a first capacitor coupled to the gate terminal of the first transistor and the ground voltage.

7. The apparatus of claim 6, wherein the first bias circuit comprises a second transistor and a third transistor, wherein the second and third transistors are configured with n-channel metal oxide semiconductor field-effect transistors (MOSFETs).

8. The apparatus of claim 7, wherein the second transistor is configured with a drain terminal coupled to the output node and a gate terminal coupled to the first bias node.

9. The apparatus of claim 8, wherein the third transistor is configured with a gate terminal to receive the first control signal, a drain terminal coupled to a source terminal of the second transistor, and a source terminal coupled to the ground voltage.

10. The apparatus of claim 9, wherein the second bias circuit comprises a fourth transistor and a fifth transistor, wherein the fourth and fifth transistors are configured with p-channel MOSFETs.

11. The apparatus of claim 10, wherein the fourth transistor is configured with a gate terminal coupled to the second bias node and a drain terminal coupled to the output node.

12. The apparatus of claim 11, wherein the fifth transistor is configured with a gate terminal to receive the second control signal, a drain terminal coupled to a source terminal of the fourth transistor, and a source terminal coupled to a supply voltage.

13. The apparatus of claim 12, further comprising a second capacitor coupled to the second bias node and the supply voltage.

14. An apparatus, comprising:
a current source configured to generate current;
a switching current source circuit coupled to the current source and a first bias node to allow the current to flow through the switching current source circuit into the first bias node;
a first bias circuit configured to receive a first control signal from a phase detector, the first bias circuit configured to mirror the current flowing through the switching current source circuit in response to the first control signal;

a second bias circuit coupled to the first bias circuit at an output node and a second bias node, the second bias circuit configured to receive a second control signal from the phase detector; and a unity gain buffer having a positive input terminal, a negative input terminal, and an output terminal, the positive input terminal configured to receive an input signal, the negative input terminal coupled to the output terminal, wherein the output terminal is coupled to the output node, the first bias circuit and the second bias circuit.

15. The apparatus of claim 14, wherein the first bias circuit comprises a second transistor and a third transistor, wherein the second and third transistors are configured with n-channel MOSFETs.

16. The apparatus of claim 15, wherein the output terminal of the unity gain buffer is coupled to a source terminal of the second transistor and a drain terminal of the third transistor.

17. The apparatus of claim 14, wherein the second bias circuit comprises a fourth transistor and a fifth transistor, wherein the fourth and fifth transistors are configured with p-channel MOSFETs.

18. The apparatus of claim 17, wherein the output terminal of the unity gain buffer is coupled to a source terminal of the fourth transistor and a drain terminal of the fifth transistor.

19. A phase-locked loop, comprising:
a phase detector configured to receive a reference signal and a divider output signal and output a control signal and a complementary control signal;

a charge pump comprising:
  a current source configured to generate current;
  a switching current source circuit coupled to the current source and a first bias node to allow the current to flow through the switching current source circuit into the first bias node;
  a first bias circuit configured to receive a first control signal from a phase detector, the first bias circuit configured to mirror the current flowing through the switching current source circuit in response to the first control signal;
  a second bias circuit coupled to the first bias circuit at an output node and a second bias node, the second bias circuit configured to receive a second control signal from the phase detector;
  a transconductance amplifier configured to receive a feedback signal from the output node and generate an output current to control the second biasing node;

a low pass filter configured to receive the current pulse train signal and output a control voltage;

a voltage controlled oscillator configured to receive the control voltage and output a corresponding frequency signal; and a frequency divider configured receive the corresponding frequency signal and output the divider output signal for feedback to the phase detector.

20. The phase-locked loop of claim 19, wherein the first bias circuit is a DN bias circuit and the second bias circuit is an UP bias circuit.

* * * * *